US012690379B2

(12) United States Patent
Kim et al.

(10) Patent No.: US 12,690,379 B2
(45) Date of Patent: Jul. 21, 2026

(54) DISPLAY PANEL AND THIN FILM TRANSISTOR INCLUDING A CONTROL ELECTRODE COMPRISING MOLYBDENUM, NITROGEN AND CHLORINE

(71) Applicant: Samsung Display Co., Ltd., Yongin-si (KR)

(72) Inventors: Daesoo Kim, Yongin-si (KR); Daewon Choi, Yongin-si (KR); Yunjong Yeo, Yongin-si (KR); Sungwon Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 255 days.

(21) Appl. No.: 18/470,254

(22) Filed: Sep. 19, 2023

(65) Prior Publication Data

US 2024/0172546 A1 May 23, 2024

(30) Foreign Application Priority Data

Nov. 22, 2022 (KR) ......................... 10-2022-0157435

(51) Int. Cl.
    *H10K 71/20* (2023.01)
    *H10K 59/12* (2023.01)
    *H10K 59/124* (2023.01)

(52) U.S. Cl.
    CPC ....... *H10K 71/231* (2023.02); *H10K 59/1201* (2023.02); *H10K 59/124* (2023.02)

(58) Field of Classification Search
    CPC ........... H10K 59/1201; H10K 59/1213; H10K 59/124; H10K 59/131; H10K 71/00;
    (Continued)

(56) References Cited

U.S. PATENT DOCUMENTS 6,886,573 B2    5/2005    Hobbs et al.
8,563,429 B2    10/2013   Hur et al.
                (Continued)

FOREIGN PATENT DOCUMENTS

CN      102417156 B     4/2012
CN      106298668 A     1/2017
                (Continued)

OTHER PUBLICATIONS

Morel, T et al., Tungsten metal gate etching in Cl2/O2 inductively coupled high density plasmas. Journal of Vacuum Science & Technology B: Microelectronics and Nanometer Structures, 26(6), 1875-1882. 2008 https://doi.org/10.1116/1.3002392.

*Primary Examiner* — Nelson Garces
(74) *Attorney, Agent, or Firm* — Womble Bond Dickinson (US) LLP

(57) ABSTRACT

A method for manufacturing a display panel is provided, the method including forming a semiconductor pattern on a base layer, applying at least one insulation layer on the semiconductor pattern, and applying a control electrode on the insulation layer so as to overlap at least a portion of the semiconductor pattern. The applying of the control electrode includes depositing molybdenum to form a preliminary electrode layer, forming a photoresist pattern on the preliminary electrode layer, and applying an etching gas to dry-etch the preliminary electrode layer. In an embodiment, in the dry-etching, the etching gas may include a nitrogen trifluoride gas, an oxygen gas, and a chlorine gas. Accordingly, it is possible to implement a manufacturing process of an eco-friendly display panel while increasing the yield and reliability of the display panel manufacturing process.

10 Claims, 10 Drawing Sheets

(58) Field of Classification Search
CPC .. H10K 71/231; H10K 71/821; H10K 50/805;
H10D 86/021; H10D 86/40; H10D
86/441; H10D 86/60; H10H 29/142
See application file for complete search history.

(56) References Cited

U.S. PATENT DOCUMENTS

| | | | |
|---|---|---|---|
| 10,039,333 B2 | 8/2018 | Hamilton et al. | |
| 2003/0092280 A1 | 5/2003 | Lee et al. | |
| 2003/0186074 A1 | 10/2003 | Chen et al. | |
| 2011/0284847 A1* | 11/2011 | Endo ................. | H10D 30/6704 |
| | | | 257/E29.273 |
| 2012/0187396 A1* | 7/2012 | Yamazaki .......... | H10D 30/6755 |
| | | | 257/E29.296 |
| 2012/0315730 A1* | 12/2012 | Koezuka ............ | H10D 30/6755 |
| | | | 257/E21.409 |
| 2019/0355774 A1* | 11/2019 | Misaki .................. | H10F 39/811 |
| 2020/0066765 A1 | 2/2020 | Cho et al. | |
| 2022/0392946 A1* | 12/2022 | Nakano ................ | G01T 1/2006 |
| 2024/0072064 A1* | 2/2024 | Choi .................... | H10D 86/481 |

FOREIGN PATENT DOCUMENTS

| | | |
|---|---|---|
| CN | 106910714 A | 6/2017 |
| JP | 2018-121051 A | 8/2018 |
| KR | 10-0170412 B1 | 3/1999 |
| KR | 10-2005-0011210 A | 1/2005 |
| KR | 10-2007-0108032 A | 11/2007 |
| KR | 10-1566922 B1 | 11/2015 |
| KR | 10-2020-0023573 A | 3/2020 |

\* cited by examiner

DR3

DR3

30/40/30 ( FRC : Corner/Middle/Center )

| SF6/O2 | | E/R | 2454 | U/F | 11% |
|---|---|---|---|---|---|
| | | MAX | 2671 | MIN | 2161 |
| 2161 | 2360 | 2389 | 2457 | 2506 | 2659 |
| 2277 | 2410 | 2348 | 2380 | 2593 | 2671 |
| 2381 | 2449 | 2408 | 2417 | 2644 | 2665 |

3500
3000
2500
2000
1500
1000

2454 Å /min
U/F 11%

| 10/10/80 ( FRC : Corner/Middle/Center ) | | | | | |
|---|---|---|---|---|---|
| NF3/O2/Cl2 | E/R | 2513 | U/F | 11% | |
| Cl2 50 | MAX | 2814 | MIN | 2276 | |
| 2686 | 2506 | 2534 | 2600 | 2516 | 2722 |
| 2426 | 2276 | 2468 | 2488 | 2298 | 2348 |
| 2814 | 2508 | 2536 | 2484 | 2428 | 2598 |

3500
3000
2500
2000
1500
1000

2513 Å /min
U/F 11%

DISPLAY PANEL AND THIN FILM TRANSISTOR INCLUDING A CONTROL ELECTRODE COMPRISING MOLYBDENUM, NITROGEN AND CHLORINE

CROSS-REFERENCE TO RELATED APPLICATION

This application claims priority to and the benefit of Korean Patent Application No. 10-2022-0157435, filed on Nov. 22, 2022, the entire content of which is hereby incorporated by reference.

BACKGROUND

A display device includes a plurality of signal lines, a plurality of pixels, and driving circuits (for example, a gate driving circuit and a data driving circuit) for controlling the plurality of pixels. Each of the plurality of pixels includes a display element and a driving circuit of the pixel for controlling the display element. The driving circuit of the pixel may include a plurality of thin film transistors which are electrically or operably coupled (e.g., connected) to each other.

A fluorine-based gas can be utilized in a dry-etching process of an electrode and a wiring included in the plurality of thin film transistors. The fluorine-based gas has excellent or suitable efficiency of etching the electrode and the wiring, but the emission amount of a greenhouse gas such as carbon dioxide ($CO_2$) is high during an etching process, so that one or more suitable methods are being developed to reduce the generation of such a greenhouse gas.

This background section is intended to provide certain background information that may be useful in understanding the present disclosure and, as such, is not an admission of prior art.

SUMMARY

An aspect of the present disclosure herein relates to a display panel, a transistor included in the display panel, and a method for manufacturing the display panel. For example, the present disclosure herein relates to a display panel capable of reducing the generation of carbon dioxide, which is generated during a manufacturing process, a transistor included in the display panel, and a method for manufacturing the display panel.

An aspect of the present disclosure provides a display panel with improved reliability while reducing greenhouse gases generated during a manufacturing process.

An aspect of the present disclosure provides a thin film transistor with improved reliability while reducing greenhouse gases generated during a manufacturing process.

An aspect of the present disclosure provides a method for manufacturing a display panel, the method being capable of reducing greenhouse gases generated during the process and having an excellent or suitable manufacturing process yield.

Additional aspects will be set forth in part in the description which follows and, in part, will be apparent from the description, or may be learned by practice of the presented embodiments of the disclosure.

An embodiment of the present disclosure provides a method for manufacturing a display panel, the method including forming a semiconductor pattern on a base layer, applying at least one insulation layer on the semiconductor pattern, and applying a control electrode on the insulation layer so as to overlap at least a portion of the semiconductor pattern. In an embodiment, the applying of the control electrode may include forming a preliminary electrode layer by depositing molybdenum, forming a photoresist pattern on the preliminary electrode layer, and applying an etching gas to dry-etch the preliminary electrode layer. In an embodiment, in the dry-etching, the etching gas may include (e.g., be) a nitrogen trifluoride gas, an oxygen gas, and a chlorine gas.

In an embodiment, in the applying the etching gas, the partial pressure of the nitrogen trifluoride gas may be about 50 mT to about 80 mT.

In an embodiment, in the applying the etching gas, the flow rate of the nitrogen trifluoride gas may be about 50 sccm to about 150 sccm.

In an embodiment, in the etching gas, the ratio of the nitrogen trifluoride gas to the total amount of the nitrogen trifluoride gas and the oxygen gas may be about 30% to about 50%.

In an embodiment, in the applying the etching gas, the flow rate of the chlorine gas may be about 30 sccm to about 90 sccm.

In an embodiment, the applying of the control electrode may further include, after the dry-etching, removing the photoresist pattern.

In an embodiment, the applying of the control electrode may further include, after the dry-etching, cleaning the surface of the control electrode.

In an embodiment, after the dry-etching, an electrode main body part including (e.g., being) the molybdenum, and a residue on the surface of the electrode main body part, and including (e.g., being) the nitrogen and the chlorine may be formed.

In an embodiment, the etching gas may not include (e.g., may exclude) sulfur hexafluoride ($SF_6$) (e.g., not include any sulfur hexafluoride).

In an embodiment, the method for manufacturing a display panel may further include applying a light emitting element electrically coupled (e.g., connected) to the semiconductor pattern.

In an embodiment of the present disclosure, a display panel includes a base layer, at least one thin film transistor on the base layer, and a light emitting element electrically coupled (e.g., connected) to the at least one thin film transistor, wherein the at least one thin film transistor includes a first semiconductor pattern on the base layer, and a first control electrode on the first semiconductor pattern, and overlapping at least a portion of the first semiconductor pattern, wherein the first control electrode includes (e.g., is) molybdenum, nitrogen and chlorine.

In an embodiment, the first control electrode may include an electrode main body part including (e.g., being) the molybdenum, and a residue on the surface of the electrode main body part, and including (e.g., being) the nitrogen and the chlorine.

In an embodiment, the electrode main body part may include an upper surface parallel (e.g., substantially parallel) to the base layer, and a side surface extended from the upper surface, wherein the residue may be on the side surface of the electrode main body part.

In an embodiment, the residue may not be on the upper surface.

In an embodiment, the first semiconductor pattern may include an active region, a source region, and a drain region, wherein the first control electrode may overlap the active region.

In an embodiment, the display panel may further include a first insulation layer on the base layer, and covering the first semiconductor pattern, wherein the first insulation layer may be between the first semiconductor pattern and the first control electrode.

In an embodiment, the first control electrode may not include (e.g., may exclude) sulfur (e.g., not include any sulfur).

In an embodiment, the width of the first control electrode may be about 1.5 micrometers to about 2.5 micrometers.

In an embodiment of the present disclosure, a thin film transistor includes a first semiconductor pattern including an active region, a source region, and a drain region, at least one insulation layer on the first semiconductor pattern, and a first control electrode on the at least one insulation layer, and overlapping the active region of the first semiconductor pattern, wherein the first control electrode includes (e.g., is) molybdenum, nitrogen and chlorine.

In an embodiment, the first control electrode may include an electrode main body part including (e.g., being) the molybdenum, and a residue on the surface of the electrode main body part, and including (e.g., being) the nitrogen and the chlorine.

BRIEF DESCRIPTION OF THE FIGURES

The accompanying drawings are included to provide a further understanding of the present disclosure, and are incorporated in and constitute a part of this specification. The drawings illustrate some embodiments of the present disclosure and, together with the description, serve to explain principles of the present disclosure.

In the drawings.

DETAILED DESCRIPTION

Figure 1:
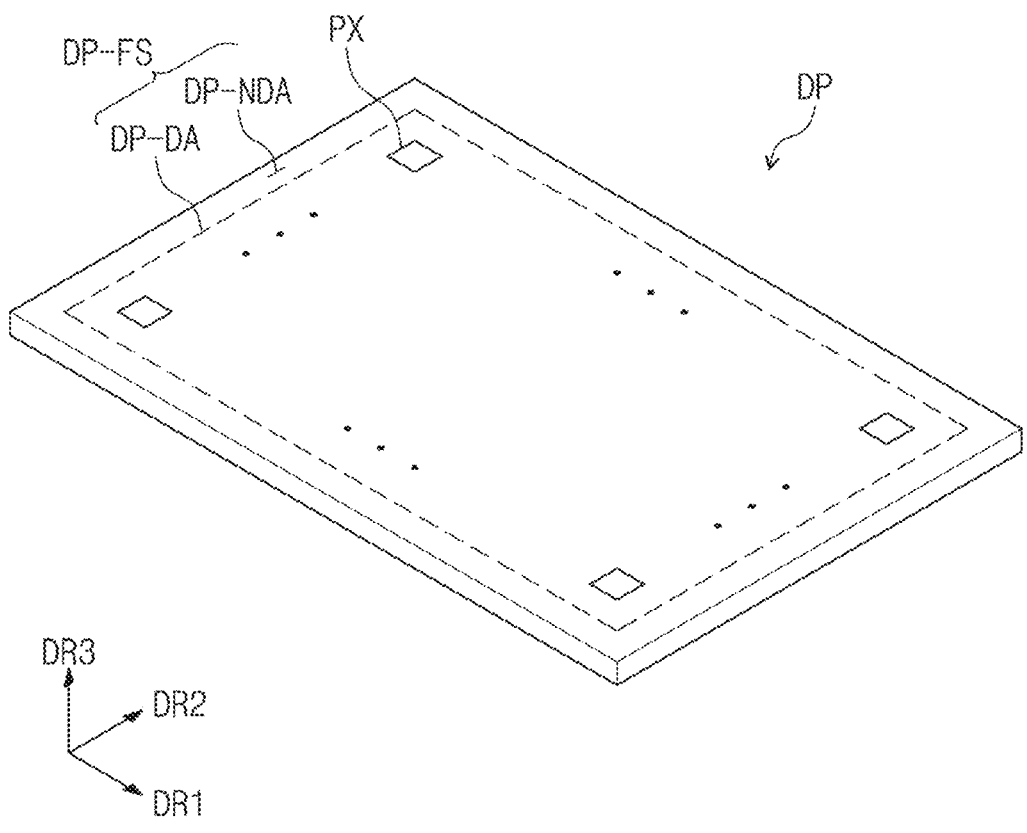
FIG. 1 is a perspective view of a display panel according to an embodiment of the present disclosure.

The present disclosure may be modified in many alternate forms, and thus specific embodiments will be illustrated in the drawings and described in more detail. It should be understood, however, that it is not intended to limit the present disclosure to the particular forms disclosed, but rather, is intended to cover all modifications, equivalents, and alternatives falling within the spirit and scope of the present disclosure.

As used herein, the use of the term "may," when describing embodiments of the present disclosure, refers to "one or more embodiments of the present disclosure." As used herein, the term "and/or" includes any and all combinations of one or more of the associated listed items.

Like reference numerals are utilized to refer to like elements in describing each drawing. In the accompanying drawings, the dimensions of elements are exaggerated for clarity of the present disclosure. It will be understood that, although the terms "first," "second," etc. may be utilized herein to describe various elements, these elements should not be limited by these terms. These terms are only utilized to distinguish one element from another. For example, a first element may be referred to as a second element, and a second element may also be referred to as a first element in a similar manner without departing the scope of rights of the present disclosure. The terms of a singular form may include plural forms unless the context clearly indicates otherwise.

In the present application, it should be understood that the terms "include" or "have" are intended to specify the presence of stated features, integers, steps, tasks, operations, elements, components, or combinations thereof in the disclosure, but do not preclude the presence or addition of one or more other features, integers, steps, tasks, operations, elements, components, or combinations thereof.

In the present disclosure, when a portion such as a layer, a film, a region, or a plate is referred to as being " " ""on" or "above" an other portion, it includes not only the case in which the portion is "directly on" the other portion, but also the case in which one or more intervening portions are disposed therebetween. When a portion such as a layer, a film, a region, or a plate is referred to as being " " ""under" or "below" an other portion, it includes not only the case in which the portion is "directly under" the other portion, but also the case in which one or more intervening portions are disposed therebetween. In the present disclosure, being disposed "on" not only includes the case of being disposed above, but also the case of being disposed, for example, below.

As used herein, the term "substantially" and similar terms are used as terms of approximation and not as terms of degree, and are intended to account for the inherent deviations in measured or calculated values that would be recognized by those of ordinary skill in the art. Also, the term "about" and similar terms, when used herein in connection with a numerical value or a numerical range, are inclusive of the stated value and mean within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations, or within ±30%, 20%, 10%, 5% of the stated value.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinafter, with reference to FIG. 1 to FIG. 5, a display panel according to an embodiment of the present disclosure, and a thin film transistor included in the display panel will be described.

Figure 2:
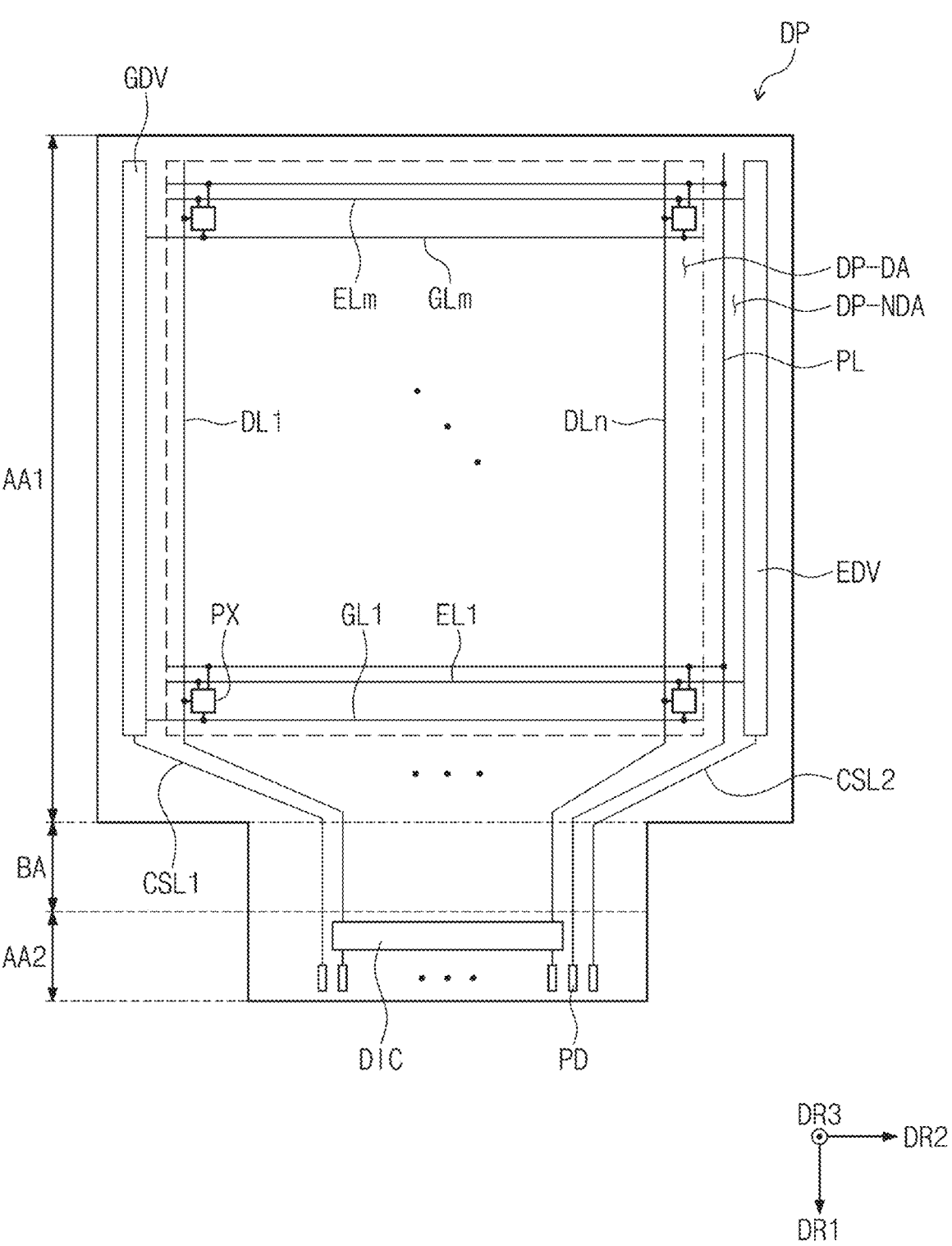
FIG. 2 is a plan view of a display panel according to an embodiment of the present disclosure.

FIG. 1 is a perspective view of a display panel according to an embodiment of the present disclosure. FIG. 2 is a plan view of a display panel according to an embodiment of the present disclosure.

A front surface DP-FS of a display panel DP is parallel (e.g., substantially parallel) to a plane defined by a first direction DR1 and a second direction DR2. A normal direction of the front surface DP-FS of the display panel DP, for example, a thickness direction of the display panel DP is indicated by a third direction DR3. An upper surface (or front surface) and a lower surface (or a rear surfaces) of each of layers constituting the display panel DP are distinguished by the third direction DR3. Hereinafter, first to third directions are directions respectively indicated by the first to third directions DR1, DR2, and DR3, and are given the same reference numerals.

As illustrated in FIG. 1, the display panel DP includes a display region DP-DA in which pixels PX are displayed on the front surface DP-FS, and a non-display region DP-NDA adjacent to the display region DP-DA. The non-display region DP-NDA is a region in which the pixels PX are not disposed. In the non-display region DP-NDA, some of signal lines and/or a driving circuit, and/or the like may be disposed.

As illustrated in FIG. 1, the display region DP-DA may have a quadrangular shape. The non-display region DP-NDA may be around (e.g., partially or entirely surround) the display region DP-DA. However, the embodiment of the present disclosure is not limited thereto, and the shape of the display region DP-DA and the shape of the non-display region DP-NDA may be relatively designed. For example, the non-display region DP-NDA may be disposed only in a region facing in the first direction DR1 (e.g., only at two opposite sides of the display region DP-DA along the first direction DR1 or the two short sides). The display region DP-DA may have a circular shape.

Referring to FIG. 2, the display panel DP may include the display region DP-DA and the non-display region DP-NDA around the display region DP-DA, and the display region DP-DA and the non-display region DP-NDA may be distinguished by the presence of a pixel PX (or lack of any pixel PX). The pixel PX may be disposed in the display region DP-DA, and a gate driver GDV, a data driver, and a light emission driver EDV may be disposed in the non-display region DP-NDA. The data driver may be a part of circuits configured in a driving chip DIC illustrated in FIG. 2.

The display panel DP includes a first region AA1, a second region AA2, and a bending region BA distinguished in the second direction DR2. The second region AA2 and the bending region BA may be parts of the non-display region DP-NDA. The bending region BA is disposed between the first region AA1 and the second region AA2. For example, the bending region BA may be between the first region AA1 and the second region AA2 in the first direction DR1.

The first region AA1 is a region corresponding to the front surface DP-FS of FIG. 1. In the second direction DR2, the length of the bending region BA and the length of the second region AA2 may be less than the length of the first region AA1. A region having a short length in a bending axis direction may be more easily bent.

The display panel DP may include a plurality of pixels PX, a plurality of gate lines GL1 to GLm, a plurality of data lines DL1 to DLn, a plurality of light emission lines EL1 to Elm, first and second control lines CSL1 and CSL2, a power line PL, and a plurality of pads PD. Here, m and n are natural numbers. The pixels PX may be coupled (e.g., connected) to the gate lines GL1 to GLm, the data lines DL1 to DLn, and the light emission lines EL1 to Elm.

The gate lines GL1 to GLm may be extended in the second direction DR2 and be coupled (e.g., connected) to the gate driver GDV. The data lines DL1 to DLn may be extended in the first direction DR1, and may be coupled (e.g., connected) to the driving chip DIC via the bending region BA. The light emission lines EL1 to Elm may be extended in the second direction DR2 and be coupled (e.g., connected) to the light emission driver EDV.

The power line PL may include a portion extended in the first direction DR1 and a portion extended in the second direction DR2. The portion extended in the first direction DR1 and the portion extended in the second direction DR2 may be disposed on different layers. The portion of the power line PL extended in the first direction DR1 may be extended to the second region AA2 via the bending region BA. The power line PL may provide a first voltage to the pixels PX.

The first control line CSL1 may be coupled (e.g., connected) to the gate driver GDV, and may be extended toward a lower end of the second region AA2 via the bending region BA. The second control line CSL2 may be coupled (e.g., connected) to the light emission driver EDV, and may be extended toward the lower end of the second region AA2 via the bending region BA.

On a plane, the pads PD may be disposed adjacent to the lower end of the second region AA2 (e.g., adjacent to an end of the second region AA2 opposite to the bending region BA). The driving chip DIC, the power line PL, the first control line CSL1, and the second control line CSL2 may be coupled (e.g., connected) to the pads PD. A flexible circuit board (FCB) may be electrically coupled (e.g., connected) to the pads PD through an anisotropic conductive adhesive layer.

The pixels PX may be divided into a plurality of groups depending on colors displayed. The pixels PX may include, for example, red pixels, green pixels, and blue pixels. The pixels PX may include (e.g., further include) white pixels. Even when divided into different groups depending on the colors displayed, the pixels PX may have the same pixel driving circuit.

The gate driver GDV circuit may generate a plurality of gate signals (hereinafter, gate signals), and sequentially output the gate signals to the plurality of gate lines GL1 to GLm. The gate driver GDV may further output another control signal to a driving circuit of the pixels PX.

The gate driver GDV may include a plurality of thin film transistors formed through the same process, for example, a Low Temperature Polycrystalline Silicon (LTPS) process or a Low Temperature Polycrystalline Oxide (LTPO) process, through which the driving circuit of the pixels PX is formed.

In the present embodiment, each of the pixels PX may be a light emitting type or kind pixel. For example, the pixel PX may include an organic light emitting diode or a quantum dot light emitting diode as a light emitting element. A light emitting layer of the organic light emitting diode may include (e.g., be) an organic light emitting material. A light emitting layer of the quantum dot light emitting diode may include (e.g., be) a quantum dot, a quantum load, and/or the like. Hereinafter, the pixel PX is described as an organic light emitting pixel.

The pixel PX includes an organic light emitting diode and a pixel driving circuit for driving the organic light emitting diode. The organic light emitting diode may be a front emitting type or kind diode, or a rear emitting type or kind diode. The pixel driving circuit includes at least a switching thin film transistor, a driving thin film transistor, and a capacitor. A high power voltage may be provided to the driving thin film transistor, and a low power voltage may be provided to one electrode of the organic light emitting diode. The thin film transistor controls a driving current flowing in the organic light emitting diode in correspondence to an amount of charge stored in the capacitor. The switching thin film transistor outputs a data signal applied to a data line in response to a gate signal applied to a gate line. The capacitor may charge a voltage corresponding to the data signal received from the switching thin film transistor.

The pixel driving circuit may include, for example, six or seven thin film transistors, including the switching thin film transistor and the driving thin film transistor. The configuration of the pixel driving circuit is not particularly limited. Depending on the configuration of the pixel driving circuit, the design of signal lines coupled (e.g., connected) to the pixel driving circuit may also be changed or configured.

Figure 3:
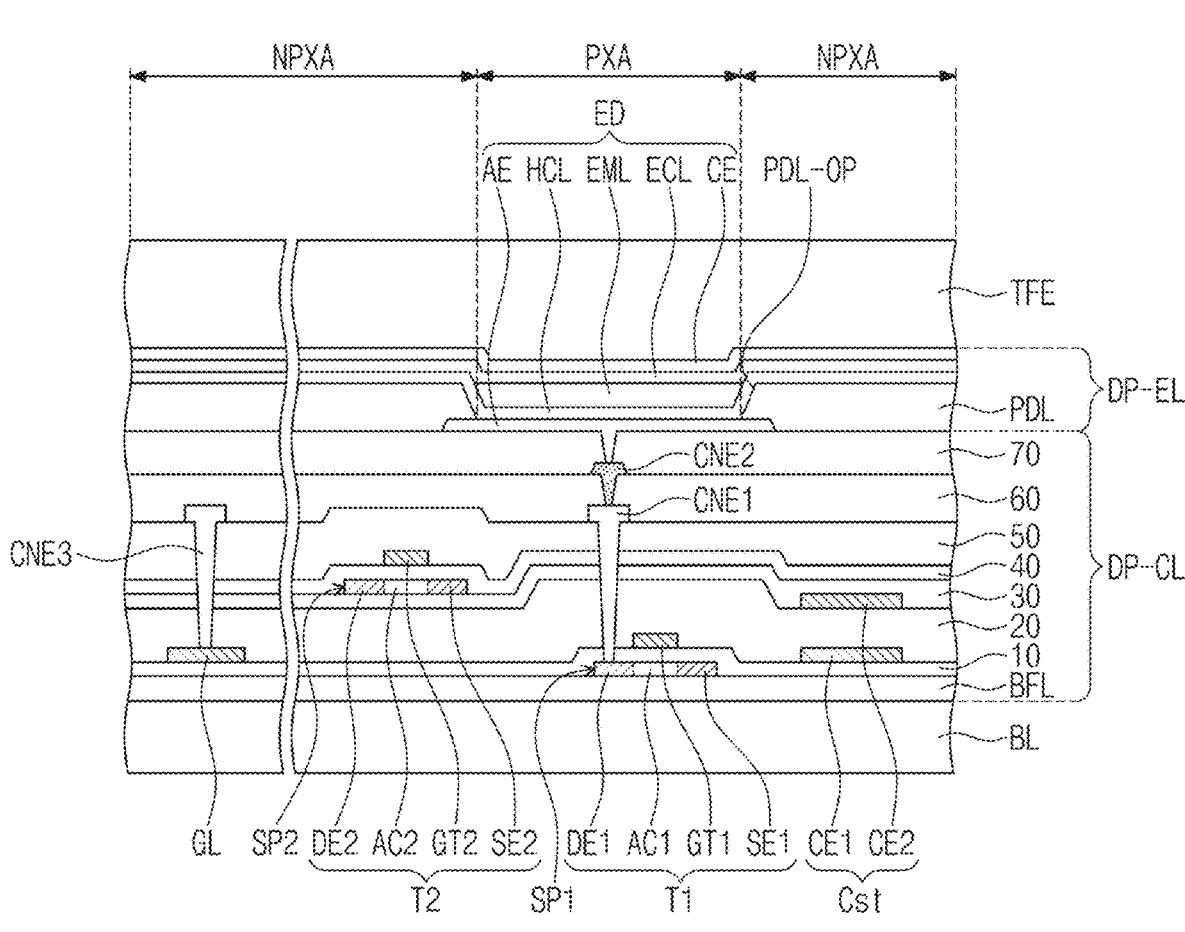
FIG. 3 is a cross-sectional view corresponding to a portion of a pixel according to an embodiment of the present disclosure.
Figure 3:

FIG. 3 is a cross-sectional view corresponding to a portion of a pixel according to an embodiment of the present disclosure. In FIG. 3, a cross-section corresponding to a first thin film transistor T1, a second thin film transistor T2, a storage capacitor Cst, and a light emitting element ED is illustrated as a part of the pixel PX. In addition, a cross-section corresponding to a gate line GL is additionally illustrated.

As illustrated in FIG. 3, the display panel DP may include a base layer BL, a circuit element layer DP-CL disposed on the base layer BL, a display element layer DP-EL, and a thin film encapsulation layer TFE.

The circuit element layer DP-CL includes at least a plurality of insulation layers and a circuit element. Hereinafter, the insulation layers may include an organic insulation layer and/or an inorganic insulation layer.

The circuit element includes a signal line and a driving circuit of a pixel, and/or the like. The circuit element layer DP-CL may be formed through a forming process of an insulation layer, a semiconductor layer, and a conductive layer by coating, deposition, and/or the like, and a patterning process of the insulation layer, the semiconductor layer, and the conductive layer by a photolithography process. The display element layer DP-EL includes a light emitting element. The display element layer DP-EL may include an organic layer such as a pixel definition film PDL.

The base layer BL may include (e.g., be) a synthetic resin film or layer. A synthetic resin layer may include (e.g., be) a thermosetting resin. For example, the synthetic resin layer may be a polyimide-based resin layer, and the material thereof is not particularly limited. The synthetic resin layer may include (e.g., be) at least any one of an acrylic resin, a methacrylic resin, polyisoprene, a vinyl-based resin, an epoxy-based resin, a urethane-based resin, a cellulose-based resin, a siloxane-based resin, a polyamide-based resin, or a perylene-based resin. In some embodiments, the base layer BL may include a glass substrate, a metal substrate, an organic/inorganic composite substrate, and/or the like.

On an upper surface of the base layer BL, at least one inorganic insulation layer may be disposed. The inorganic insulation layer may include (e.g., be) at least one of an aluminum oxide, a titanium oxide, a silicon nitride, a silicon oxide, a silicon oxynitride, a zirconium oxide, or a hafnium oxide. The inorganic insulation layer may be formed of multiple layers. The multi-layered inorganic insulation layers may constitute a buffer layer BFL. The buffer layer BFL may prevent or block foreign substances from being introduced from the outside. The buffer layer BFL may prevent or reduce a phenomenon in which metal atoms and/or impurities from the base layer BL diffuse into a first semiconductor pattern SP1 and/or the like on an upper side. In some embodiments, the buffer layer BFL may improve coupling force with respect to conductive patterns or semiconductor patterns directly formed on the base layer BL. The first semiconductor pattern SP1 may include an active region AC1 of the first thin film transistor T1, and the buffer layer BFL may adjust a supply speed of heat during a crystallization process for forming the first semiconductor pattern SP1 to uniformly form the first semiconductor pattern SP1.

In some embodiments, a rear metal layer may be disposed in a lower portion of each of the first thin film transistor T1 and the second thin film transistor T2. The rear metal layer may be disposed overlapping semiconductor patterns SP1 and SP2 of each of the first thin film transistor T1 and the second thin film transistor T2. The rear metal layer may block or reduce external light from reaching the semiconductor patterns SP1 to SP2.

The rear metal layer may be coupled (e.g., connected) to an electrode or a wiring, and may receive a constant voltage or a signal therefrom. The rear metal layer may be a floating electrode in an isolated form with another electrode or wiring. The rear metal layer may include (e.g., be) a reflective metal.

The first semiconductor pattern SP1 of the first thin film transistor T1 may be disposed on the buffer layer BFL. The first semiconductor pattern SP1 may include (e.g., be) a silicon semiconductor. For example, the silicon semiconductor may include (e.g., be) amorphous silicon, polycrystalline silicon, and/or the like. For example, the first semiconductor pattern SP1 may include (e.g., be) low-temperature polysilicon.

FIG. 3 illustrates only a portion of the first semiconductor pattern SP1 disposed on the buffer layer BFL, and the first semiconductor pattern SP1 may be further disposed in other regions. The first semiconductor pattern SP1 may be arranged across pixels according to a specific rule. The first semiconductor pattern SP1 may have different electrical properties depending on whether or not it is doped. The first semiconductor pattern SP1 may include a first region having high conductivity and a second region having low conductivity. The first region may be doped with an N-type or kind dopant or a P-type or kind dopant. A P-type or kind transistor may include a doped region which has been doped with the P-type or kind dopant, and an N-type or kind transistor may include a doped region which has been doped with the N-type or kind dopant. The second region may be a non-doped region, or a region doped to a concentration lower than that of the first region.

The conductivity of the first region may be greater than the conductivity of the second region, and the first region may substantially serve as an electrode or a signal line. The second region may substantially correspond to an active region (or a channel) of a transistor. For example, a portion of the first semiconductor pattern SP1 may be an active region of a transistor, and another portion thereof may be a source and/or a drain of the transistor, and the other portion thereof may be a connection electrode or a connection signal line.

A source region SE1 (or a source), an active region AC1 (or a channel), and a drain region DE1 (or a drain) of the first thin film transistor T1 may be formed from the first semiconductor pattern SP1. The source region SE1 and the drain region DE1 may be extended in opposite directions from the active region AC1 on a cross-section.

A first insulation layer 10 may be disposed on the buffer layer BFL. The first insulation layer 10 commonly overlaps a plurality of pixels, and may cover the first semiconductor pattern SP1. The first insulation layer 10 may be an inorganic layer and/or an organic layer, and may have a single-layered or a multi-layered structure. The first insulation layer 10 may include (e.g., be) at least one of an aluminum oxide, a titanium oxide, a silicon oxide, a silicon nitride, a silicon oxynitride, a zirconium oxide, or a hafnium oxide. In some embodiments, the first insulation layer 10 may be a single-layered silicon oxide layer. In some embodiments, the first insulation layer 10 may be an inorganic layer formed through Chemical Vapor Deposition (CVD). Not only the first insulation layer 10 but also a plurality of insulation layers may be included in the circuit element layer DP-CL to be described later and they may be inorganic insulation layers and/or organic insulation layers, and may each have a single-layered or a multi-layered structure. An inorganic insulation layer may include (e.g., be) at least one of the above-described materials, but is not limited thereto.

A first control electrode GT1 of the first thin film transistor T1 is disposed on the first insulation layer 10. The first control electrode GT1 may be a portion of a metal pattern. The first control electrode GT1 overlaps at least a portion of the first semiconductor pattern SP1. The first control electrode GT1 may overlap the active region AC1 of the first semiconductor pattern SP1. In a process of doping the first semiconductor pattern SP1, the first gate electrode GT1 may serve as a mask.

The first control electrode GT1 may include (e.g., be) molybdenum (Mo). The first control electrode GT1 may further include (e.g., may be) nitrogen (N) and chlorine (Cl) in addition to molybdenum (Mo). The first control electrode GT1 may include a main body part including (e.g., being) molybdenum, and a process residue including (e.g., being) nitrogen and/or chlorine. A material included in the first control electrode GT1 will be described later with reference to FIG. 4 and FIG. 5.

A barrier pattern may be further disposed below the first control electrode GT1. The barrier pattern is disposed below the first control electrode GT1, and may overlap the active region AC1 of the first semiconductor pattern SP1. The barrier pattern may include (e.g., be) a metal oxide. For example, the barrier pattern may include (e.g., be) at least one of a gallium oxide, a zinc oxide, or an indium oxide.

A second insulation layer 20 may be disposed on the first insulation layer 10, and may cover the first control electrode GT1. A third insulation layer 30 may be disposed on the second insulation layer 20. The second insulation layer 20 and the third insulation layer 30 may be inorganic insulation layers.

A first electrode CE1 of the storage capacitor Cst may be disposed between the first insulation layer 10 and the second insulation layer 20. A second electrode CE2 of the storage capacitor Cst may be disposed between the second insulation layer 20 and the third insulation layer 30. However, the embodiment of the present disclosure is not limited thereto, and each of the first electrode CE1 and the second electrode CE2 of the storage capacitor Cst may be disposed on a different insulation layer of the circuit element layer DP-CL. For example, the second electrode CE2 of the storage capacitor Cst may be disposed between a fourth insulation layer 40 and a fifth insulation layer 50.

The second semiconductor pattern SP2 of the second thin film transistor T2 may be disposed on the third insulation layer 30. The second semiconductor pattern SP2 may include an active region AC2 of the second thin film transistor T2 to be described later. The second semiconductor pattern SP2 may include (e.g., be) an oxide semiconductor. The second semiconductor pattern SP2 may include (e.g., be) a transparent conductive oxide (TCO) such as indium tin oxide (ITO), indium zinc oxide (IZO), indium gallium zinc oxide (IGZO), zinc oxide (ZnO), indium oxide ($In_2O_3$), and/or the like.

The oxide semiconductor may include a plurality of regions which are distinguished depending on whether a transparent conductive oxide has been reduced or not. A region in which the transparent conductive oxide has been reduced (hereinafter, a reduction region) has greater conductivity than a region in which the transparent conductive oxide has not been reduced (hereinafter, a non-reduction region). The reduction region substantially serves as a source/drain (a source and/or a drain) or signal line of a transistor. The non-reduction region substantially corresponds to a semiconductor region (or an active region or a channel) of a transistor. For example, a partial region of the second semiconductor pattern SP2 may be a semiconductor region of a transistor, another partial region thereof may be a source region/drain region of the transistor, and the other partial region thereof may be a signal transmissive region.

A source region SE2 (or a source), the active region AC2 (or a channel), and a drain region DE2 (or a drain) of the second thin film transistor T2 may be formed from the second semiconductor pattern SP2. The source region SE2 and the drain region DE2 may be extended in opposite directions from the active region AC2 on a cross-section.

The fourth insulation layer 40 may be disposed on the third insulation layer 30. The fourth insulation layer 40 may cover the second semiconductor pattern SP2. The fourth insulation layer 40 may be an inorganic insulation layer.

A second control electrode GT2 of the second thin film transistor T2 may be disposed on the fourth insulation layer 40. The second control electrode GT2 may be a portion of a metal pattern. The second control electrode GT2 overlaps at least a portion of the second semiconductor pattern SP2. The second control electrode GT2 may overlap the active region AC2.

A barrier pattern may be further disposed below the second control electrode GT2. The barrier pattern may be disposed below the second control electrode GT2, and may overlap the active region AC2 of the second semiconductor pattern SP2. The barrier pattern may include (e.g., be) a metal oxide. For example, the barrier pattern may include (e.g., be) at least one of a gallium oxide, a zinc oxide, or an indium oxide.

The fifth insulation layer 50 may be disposed on the fourth insulation layer 40, and may cover the second control electrode GT2. The fifth insulation layer 50 may be an inorganic insulation layer or organic insulation layer. A first connection electrode CNE1 may be disposed on the fifth insulation layer 50. The first connection electrode CNE1 may be coupled (e.g., connected) to the drain region DE1 of the first thin film transistor T1 through a contact-hole passing through the first to fifth insulation layers 10, 20, 30, 40, and 50.

A sixth insulation layer 60 may be disposed on the fifth insulation layer 50. A second connection electrode CNE2 may be disposed on the sixth insulation layer 60. The second connection electrode CNE2 may be coupled (e.g., connected) to the first connection electrode CNE1 through a contact hole passing through the sixth insulation layer 60. A seventh insulation layer 70 may be disposed on the sixth insulation layer 60, and may cover the second connection electrode CNE2.

The sixth insulation layer 60 and the seventh insulation layer 70 may each be an organic insulation layer. For example, the sixth insulation layer 60 and the seventh insulation layer 70 may each include (e.g., be) a general purpose polymer such as benzocyclobutene (BCB), polyimide, hexamethyldisiloxane (HMDSO), polymethylmethacrylate (PMMA) and/or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, a blend thereof, and/or the like.

The light emitting element ED may include a first electrode AE, a light emitting layer EML, and a second electrode CE. The second electrode CE may be commonly provided on a plurality of light emitting elements.

The first electrode AE of the light emitting element ED may be disposed on the seventh insulation layer 70. The first electrode AE of the light emitting element ED may be a (semi)transmissive electrode or a reflective electrode. According to an embodiment of the present disclosure, the first electrode AE of the light emitting element ED may include (e.g., be) a reflective layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or translucent electrode layer formed on the reflective layer. The transparent or translucent electrode layer may be provided with at least one selected from the group consisting of indium tin oxide (ITO), indium zinc oxide (IZO), indium gallium zinc oxide (IGZO), zinc oxide (ZnO), indium oxide (In$_2$O$_3$), and aluminum-doped zinc oxide (AZO). For example, the first electrode AE of the light emitting element ED may include a stacked structure of ITO/Ag/ITO.

The pixel definition film PDL may be disposed on the seventh insulation layer 70. The pixel definition film PDL may have properties of absorbing light, and for example, the pixel definition film PDL may have a black color. The pixel definition film PDL may include (e.g., be) a black coloring agent. The black coloring agent may include (e.g., be) a black dye and/or a black pigment. The black coloring agent may include (e.g., be) carbon black, a metal such as chromium, and/or an oxide thereof. The pixel definition film PDL may correspond to a light blocking pattern having light blocking properties.

The pixel definition film PDL may cover a portion of the first electrode AE of the light emitting element ED. For example, on the pixel definition film PDL, an opening PDL-OP exposing a portion of the first electrode AE of the light emitting ED may be defined. The opening PDL-OP of the pixel definition film PDL may define a light emitting region PXA. For example, the plurality of pixels PX (see FIG. 1) may be disposed according to a set or predetermined rule on a plane of the display panel DP (see FIG. 1). A region in which the plurality of pixels PX are disposed may be defined as a pixel region, and one pixel region may include the light emitting region PXA and a non-light emitting region NPXA adjacent to the light emitting region PXA. The non-light emitting region NPXA may be around (e.g., partially or entirely surround) the light emitting region PXA.

The pixel definition film PDL may increase the distance between an edge of the first electrode AE and the second electrode CE of the light emitting element ED. Therefore, the pixel definition film PDL may prevent, reduce, or suppress arcs and/or the like from occurring at the edge of the first electrode AE.

The light emitting layer EML may be disposed on the first electrode AE. The light emitting layer EML may be disposed only in a region corresponding to the opening PDL-OP. For example, light emitting layers EML of the plurality of pixels PX may disposed spaced apart from each other. However, the embodiment of the present disclosure is not limited thereto, and the light emitting layer EML may be commonly formed in the plurality of pixels PX (see FIG. 1) utilizing an open mask. The light emitting layer EML provided as a common layer may generate white light or blue light. In some embodiments, the light emitting layer EML may have a multi-layered structure.

Between the first electrode AE and the light emitting layer EML, a hole control layer HCL may be disposed. The hole control layer HCL may include a hole transport layer, and may further include a hole injection layer. In some embodiments, the hole control layer HCL may include the hole transport layer and/or the hole injection layer. Between the light emitting layer EML and the second electrode CE, an electron control layer ECL may be disposed. The electron control layer ECL may include an electron transport layer, and may further include an electron injection layer. In some embodiments, the electron control layer may include the electron transport layer and/or the electron injection layer. The hole control layer HCL and the electron control layer ECL may be commonly formed in the plurality of pixels PX (see FIG. 1) utilizing an open mask.

The thin film encapsulation layer TFE may be disposed on the display element layer DP-EL. In an embodiment of the present disclosure, the thin film encapsulation layer TFE may be replaced with an encapsulation substrate, for example, a metal substrate and/or a glass substrate. The thin film encapsulation layer TFE may include an inorganic encapsulation layer and/or an organic encapsulation layer. For example, the thin film encapsulation layer TFE may include two inorganic encapsulation layers, and one organic encapsulation layer disposed therebetween. In some embodiments, the thin film encapsulation layer TFE may have a structure in which a plurality of inorganic encapsulation layers and a plurality of organic encapsulation layers are alternately disposed. The display panel DP may further include functional layers, such as a reflection prevention layer and/or a refractive index control layer, disposed on the thin film encapsulation layer TFE. An inorganic encapsulation layer may protect the display element layer DP-EL from moisture and/or oxygen, and an organic encapsulation layer may protect the display element layer DP-EL from foreign substances such as dust particles. The inorganic encapsulation layer may include a silicon nitride layer, a silicon oxynitride layer, a silicon oxide layer, a titanium oxide layer, an aluminum oxide layer, and/or the like. The organic encapsulation layer may include an acrylic organic layer, but is not limited thereto.

The gate line GL may be formed through the same process through which the first control electrode GT1 is provided, and may include (e.g., be) the same material as the material included in the first control electrode GT1. The first control electrode GT1 may be coupled (e.g., connected) to the gate line GL on a plane. The gate line GL may provide a turn-on signal to the first thin film transistor T1.

The circuit element layer DP-CL may further include a third connection electrode CNE3 disposed on the fifth insulation layer 50. The third connection electrode CNE3 may be coupled (e.g., connected) to the gate line GL through a contact-hole passing through the second to fifth insulation layers 20, 30, 40, and 50.

Figure 4:
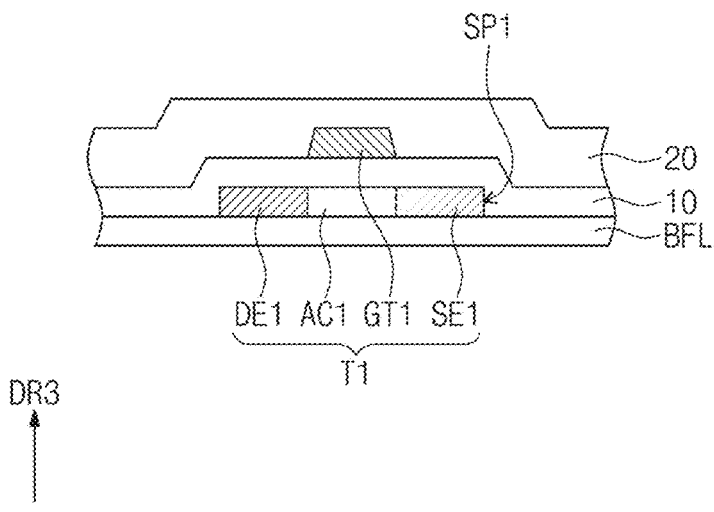
FIG. 4 is a cross-sectional view of a thin film transistor according to an embodiment of the present disclosure.
Figure 5:
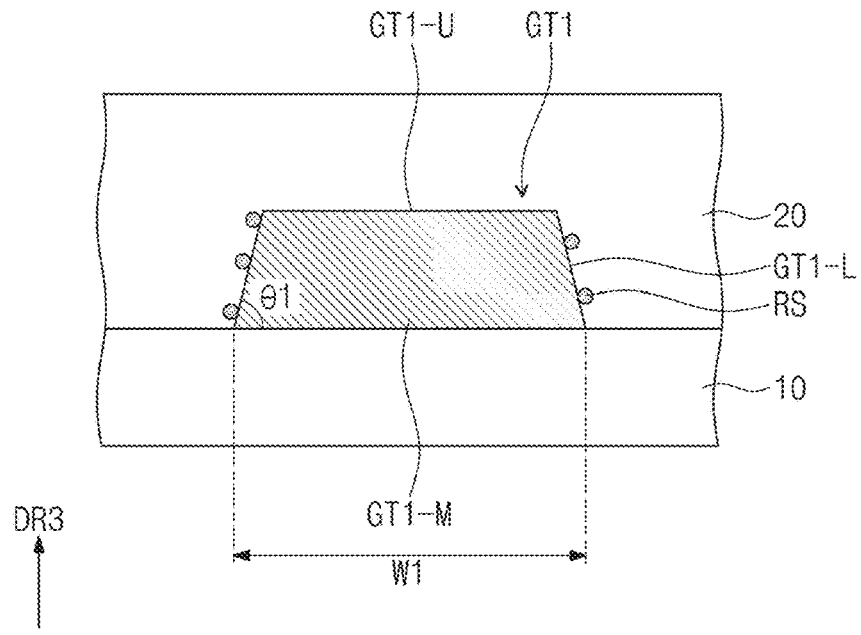
FIG. 5 is a cross-sectional view of some components included in a thin film transistor according to an embodiment of the present disclosure.

FIG. 4 is a cross-sectional view of a thin film transistor according to an embodiment of the present disclosure. FIG. 5 is a cross-sectional view of some components included in a thin film transistor according to an embodiment of the present disclosure. FIG. 4 illustrates a cross-sectional view corresponding to the first thin film transistor T1 of FIG. 3. FIG. 5 illustrates an enlarged first control electrode GT1 included in the first thin film transistor T1 of FIG. 4.

Referring to FIG. 4 and FIG. 5, the first semiconductor pattern SP1 of the first thin film transistor T1 may be disposed on the buffer layer BFL. The source region SE1, the active region AC1, and the drain region DE1 of the first thin film transistor T1 may be formed from the first semiconductor pattern SP1. The source region SE1 and the drain region DE1 may be extended in opposite directions from the active region AC1 on a cross-section.

The first insulation layer 10 may be disposed on the buffer layer BFL. The first insulation layer 10 may cover the first semiconductor pattern SP1. The first insulation layer 10 may include (e.g., be) at least one of an aluminum oxide, a titanium oxide, a silicon oxide, a silicon nitride, a silicon oxynitride, a zirconium oxide, or a hafnium oxide.

The first control electrode GT1 may be disposed on the first insulation layer 10. The first control electrode GT1 overlaps at least a portion of the first semiconductor pattern SP1. The first control electrode GT1 overlaps the active region AC1 of the first semiconductor pattern SP1. In a process of doping the first semiconductor pattern SP1, the first gate electrode GT1 may serve as a mask.

The second insulation layer 20 may be disposed on the first insulation layer 10, and may cover the first control electrode GT1. The second insulation layer 20 may include (e.g., be) at least one of an aluminum oxide, a titanium oxide, a silicon oxide, a silicon nitride, a silicon oxynitride, a zirconium oxide, or a hafnium oxide.

Referring to FIG. 5, the first control electrode GT1 may be disposed on the first insulation layer 10, and may be covered by the second insulation layer 20.

The first control electrode GT1 may include an electrode main body part GT1-M and a residue RS disposed on the surface of the electrode main body part GT1-M. For example, the residue RS may be on one or more surfaces (e.g., side surfaces) of the first control electrode GT1 between (e.g., coupled between) a surface (e.g., a lower surface) of the first control electrode GT1 facing (e.g., contacting) the first insulation layer 10 and an upper surface GT1-U of the first control electrode GT1 opposite to (e.g., facing away from) the surface of the first control electrode GT1 facing the first insulation layer 10. The residue RS may be derived from a gas utilized in a process of providing (e.g., applying, such as forming or manufacturing) the first control electrode GT1. For example, the residue RS may be a material included in a dry etching gas applied to etch and pattern the first control electrode GT1 and still remaining therein. The residue RS may be a residual material included in the dry etch gas, but not removed by a cleaning process and still remaining on the surface of the electrode main body part GT1-M. In some examples, the residue RS does not form a continuous layer over the one or more surfaces of the first control electrode GT1 that the residue RS is on. For example, the residue RS may be provided as spots, patches, balls, etc. on the one or more surfaces of the first control electrode GT1 that the residue RS is on.

In the first control electrode GT1 of an embodiment, the electrode main body part GT1-M may include (e.g., be) molybdenum (Mo), and the residue RS may include (e.g., be) nitrogen (N) and/or chlorine (CI). The electrode main body part GT1-M may be composed of molybdenum.

The electrode main body part GT1-M may be a component occupying most of the first control electrode GT1. In the first control electrode GT1 of an embodiment, the electrode main body part GT1-M may be a component with a mass of 95 wt % or greater with respect to the total mass of the first control electrode GT1, and the residue RS may be a component with a mass of, or less than, 5 wt % with respect to the total mass of the first control electrode GT1.

The residue RS may further include (e.g., be) fluorine and/or oxygen, in addition to nitrogen and/or chlorine. The residue RS may be a material included in a dry etching gas applied to etch and pattern the first control electrode GT1 as described below, and may be derived from a nitrogen trifluoride ($NF_3$) gas, an oxygen ($O_2$) gas, and/or a chlorine ($Cl_2$) gas included in the dry etching gas. In the method for manufacturing a display panel of an embodiment, the dry etching gas does not include sulfur hexafluoride ($SF_6$), so that the residue RS disposed on the surface of the electrode main body part GT1-M may not include (e.g., may exclude) sulfur (S) (e.g., not include any sulfur).

The electrode main body part GT1-M of the first control electrode GT1 may include the upper surface GT1-U, and the upper surface GT1-U may be parallel (e.g., substantially parallel) to the first insulation layer 10 (e.g., to an upper surface of the first insulation layer 10) providing a base surface, and a side surface GT1-L coupling (e.g., connecting) the first insulation layer 10 from the upper surface GT1-U. For example, the side surface GT1-L may include one or more surfaces of the electrode main body part GT1-M that are coupled (e.g., connected) between the first insulation layer 10 and the upper surface GT1-U of the first control electrode GT1. The upper surface GT1-U of the first control electrode GT1 may be parallel (e.g., substantially parallel) to the first insulation layer 10, and may be parallel (e.g., substantially parallel) to the base layer BL (see FIG. 3) of the display panel DP (see FIG. 3). The upper surface GT1-U of the first control electrode GT1 may be parallel (e.g., substantially parallel) to an upper surface of the first insulation layer 10 and/or to an upper surface of the base layer BL (see FIG. 3) of the display panel DP (see FIG. 3).

The residue RS may be disposed on the side surface GT1-L of surfaces of the electrode main body part GT1-M. The residue RS may be disposed only on the side surface GT1-L of the electrode main body part GT1-M, and may not be disposed on (e.g., may be excluded from) the upper surface GT1-U. The upper surface GT1-U of the electrode main body part GT1-M may be a portion to be covered by a photoresist pattern PR (see FIG. 7B) in a process of providing (e.g., forming or manufacturing) the first control electrode GT1 to be described later. The upper surface GT1-U of the electrode main body part GT1-M may be covered by the photoresist pattern PR (see FIG. 7B) in an etching process, so that the residue RS derived from an etching gas may not be disposed on the upper surface GT1-U of the electrode main body part GT1-M, and may be disposed only on the side surface GT1-L of the electrode main body part GT1-M.

The side surface GT1-L of the electrode main body part GT1-M may be an inclined surface inclined at a set or predetermined angle to the upper surface of the first insulation layer 10 providing the base surface. A first angle 81, which may be an angle between the side surface GT1-L of the electrode main body part GT1-M and the upper surface of the first insulation layer 10 (or a surface of the electrode main body part GT1-M facing the first insulation layer 10), may be about 40 degrees to about 80 degrees. For example, the first angle 81 may be about 45 degrees to about 55 degrees. The first angle 81 may be an angle that angularly extends through the electrode main body part GT1-M.

A width W1 of the first control electrode GT1 (e.g., a greatest width of the first control electrode GT1, or a width of a surface of the first control electrode GT1 facing the first insulation layer 10) in one direction may be about 1.5 micrometers to about 2.5 micrometers. The width W1 of the first control electrode GT1 in one direction may be about, for example, about 1.8 micrometers to about 2.2 micrometers. In some embodiments, the width W1 of the first control electrode GT1 may be defined as the farthest point among distances between the side surfaces GT1-L of the electrode main body part GT1-M. For example, as illustrated in FIG. 5, the width W1 of the first control electrode GT1 may be defined as a distance between points where the side surfaces GT1-L of the electrode main body part GT1-M meet the first insulation layer 10. The width W1 of the first control electrode GT1 in one direction may be referred to as a width of the electrode main body part GT1-M.

A thickness (e.g., a thickness in a thickness direction, such as the third direction DR3 shown in FIG. 5) of the first control electrode GT1 may be about 0.05 micrometers to about 0.5 micrometers. The thickness of the first control electrode GT1 may be, for example, about 0.1 micrometers to about 0.3 micrometers. In some embodiments, the thickness of the first control electrode GT1 may be the shortest distance from the upper surface of the first insulation layer 10 (or from the lower surface of the first control electrode GT1) to the upper surface GT1-U of the electrode main body part GT1-M. The thickness of the first control electrode GT1 may be a distance from the upper surface of the first insulation layer 10 (or from the lower surface of the first control electrode GT1) to the upper surface GT1-U of the electrode main body part GT1-M in the third direction DR3. The thickness of the first control electrode GT1 may be referred to as the thickness of the electrode main body part GT1-M.

Referring to FIG. 3 and FIG. 5 together, in the first thin film transistor T1 included in the display panel DP according to an embodiment of the present disclosure, the first control electrode GT1 includes (e.g., is) molybdenum (Mo), and further includes (e.g., is) nitrogen (N) and/or chlorine (Cl). The first control electrode GT1 includes the electrode main body part GT1-M including (e.g., being) molybdenum, and the residue RS disposed on one or more surfaces of the surfaces of the electrode main body part GT1-M, and the residue RS includes (e.g., is) the nitrogen and/or the chlorine described above. The first control electrode GT1 according to an embodiment of the present disclosure is provided by dry-etching, by an etching gas, a preliminary electrode layer formed by depositing molybdenum, and because the etching gas includes (e.g., is) a nitrogen trifluoride ($NF_3$) gas and/or a chlorine ($Cl_2$) gas, the residue RS of the etching gas remaining on the surface of the electrode main body part GT1-M of the first control electrode GT1 includes (e.g., is) nitrogen and/or chlorine. In some embodiments, when providing the first control electrode GT1 according to an embodiment, sulfur hexafluoride ($SF_6$) is not utilized as an etching gas, so that the residue RS does not include sulfur. The display panel DP of an embodiment does not utilize, in an embodiment, sulfur hexafluoride in an etching task of a process of providing the first control electrode GT1, so that the generation of a carbon dioxide ($CO_2$) gas generated during the process of providing the first control electrode GT1 may be reduced. In some embodiments, the display panel DP of an embodiment includes nitrogen trifluoride replaced with sulfur hexafluoride in an etching gas in an etching task of the manufacturing process, while additionally including a chlorine gas in the etching gas, so that the yield and reliability of the process may be improved.

Hereinafter, referring to FIG. 6A, FIG. 6B, and FIG. 7A to FIG. 7D, a method for manufacturing a display panel according to an embodiment of the present disclosure will be described.

Figure 6A:
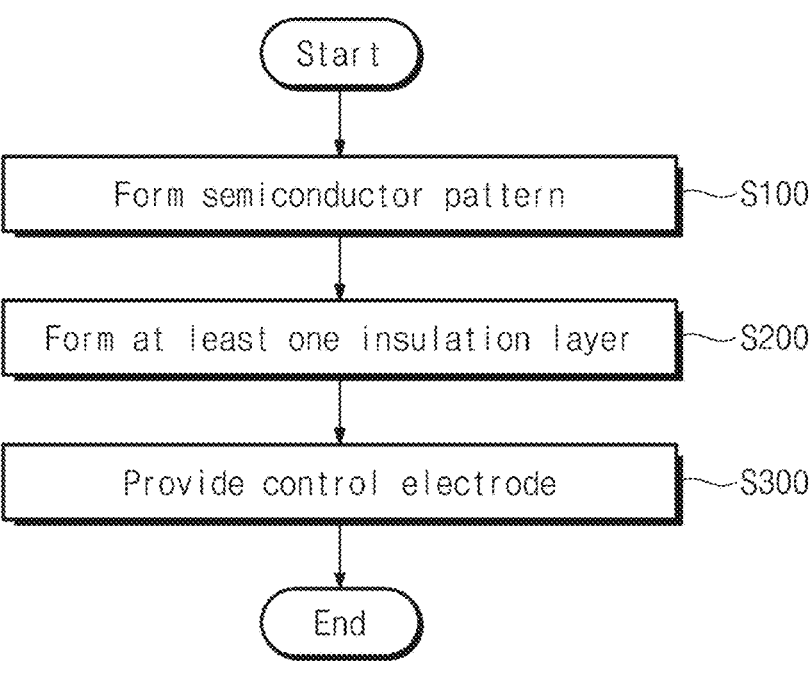
FIG. 6A is a flow chart sequentially showing a method for manufacturing a display panel according to an embodiment of the present disclosure.
Figure 6B:
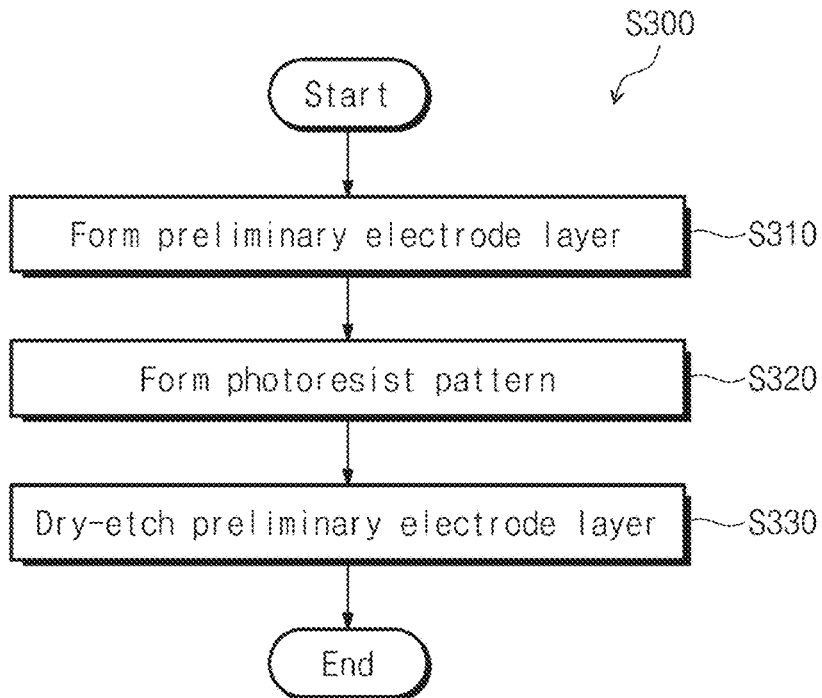
FIG. 6B is a flow chart sequentially showing some tasks of a method for manufacturing a display panel according to an embodiment of the present disclosure.

FIG. 6A is a flow chart sequentially showing a method for manufacturing a display panel according to an embodiment of the present disclosure. FIG. 6B is a flow chart sequentially showing some tasks of a method for manufacturing a display panel according to an embodiment of the present disclosure. FIG. 6B sequentially shows each task of providing a control electrode S300 of the method for manufacturing a display panel according to an embodiment.

Referring to FIG. 6A, the method for manufacturing a display panel according to an embodiment includes forming a semiconductor pattern on a base layer S100, providing at least one insulation layer on the semiconductor pattern S200, and providing a control electrode on the insulation layer so as to overlap at least a portion of the semiconductor pattern S300. Through the method for manufacturing a display panel according to an embodiment, the above-described display panel DP and the first thin film transistor T1 described with reference to FIG. 3 and FIG. 4 may be provided. In some embodiments, in the method for manufacturing a display panel according to an embodiment, the description of the first semiconductor pattern SP1 described above may be applied to the semiconductor pattern formed on the base layer, the description of the first insulation layer 10 may be applied to an insulation layer provided on the semiconductor pattern, and the description of the first control electrode GT1 may be applied to a control electrode provided on the insulation layer.

The method for manufacturing a display panel according to an embodiment may further include providing a light emitting element electrically coupled (e.g., connected) to the semiconductor pattern. In some embodiments, in the method for manufacturing a display panel according to an embodiment, the description of the light emitting element ED electrically coupled (e.g., connected) to the first semiconductor pattern SP1 described above may be applied to the light emitting element.

Referring to FIG. 6B, the providing of the control electrode S300 of an embodiment includes depositing molybdenum (Mo) to form a preliminary electrode layer S310, forming a photoresist pattern on the preliminary electrode layer S320, and dry-etching the preliminary electrode layer S330.

FIG. 7A to FIG. 7D are cross-sectional views sequentially showing some tasks of a method for manufacturing a display panel according to an embodiment of the present disclosure. FIG. 7A to FIG. 7D sequentially shows each task of the providing of the control electrode S300 of the method for manufacturing a display panel according to an embodiment. Each of FIG. 7A to FIG. 7D shows a cross-section corresponding to FIG. 5 for comparison.

Figure 7A:
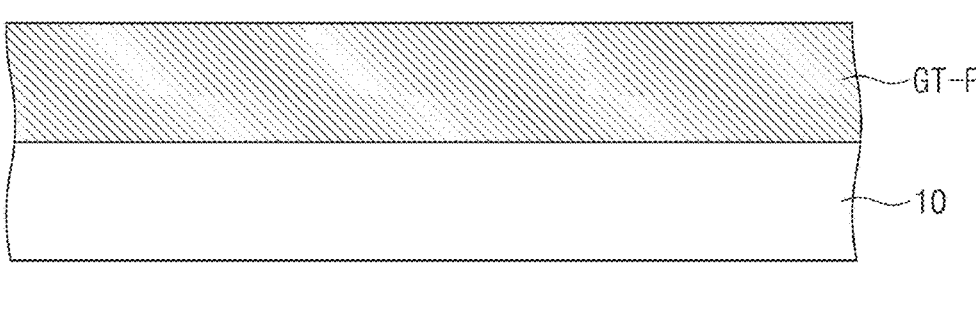
FIG. 7A-FIG. 7D are cross-sectional views sequentially showing some tasks of a method for manufacturing a display panel according to an embodiment of the present disclosure.
Figure 7A:

As illustrated in FIG. 7A, the providing of the control electrode may include depositing molybdenum (Mo) on the first insulation layer 10 to form a preliminary electrode layer GT-P. The preliminary electrode layer GT-P may be composed of molybdenum. The preliminary electrode layer GT-P may be formed by depositing molybdenum through a physical vapor deposition method or a chemical vapor deposition method. For example, the preliminary electrode layer GT-P may be formed by depositing molybdenum through a sputtering process. The preliminary electrode layer GT-P may be provided in the form of a common layer which is not patterned by utilizing an open mask.

Figure 7B:
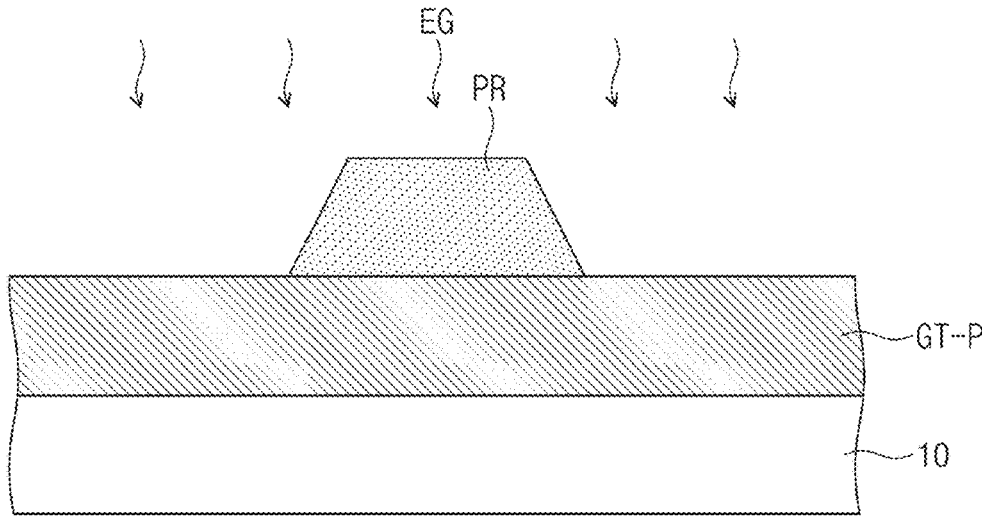
Figure 7B:

Referring to FIG. 7A and FIG. 7B together, the providing of the control electrode may further include forming the photoresist pattern PR on the preliminary electrode layer GT-P. The photoresist pattern PR may serve as a mask in an etching process to be described later.

The forming of the photoresist pattern PR may include forming a photoresist layer by coating a photoresist material on the preliminary electrode layer GT-P, and then patterning the photoresist layer through an exposure process, thereby forming the photoresist pattern PR. The photoresist material may be a negative-type or kind photoresist material or a positive-type or kind photoresist material.

Figure 7C:
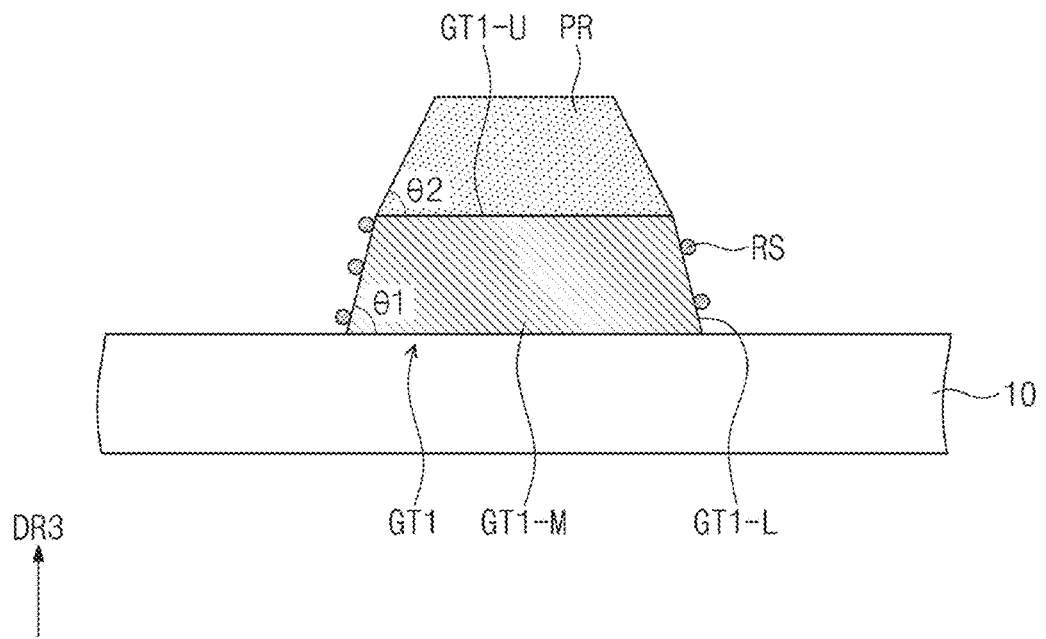

Referring to FIG. 7B and FIG. 7C together, the providing of the control electrode may include dry-etching the preliminary electrode layer GT-P by providing an etching gas EG. In the dry-etching process, the remaining portion not covered by the photoresist pattern PR in the preliminary electrode layer GT-P may be etched by utilizing the photoresist pattern PR as a mask.

The etching gas EG may include (e.g., be) a nitrogen trifluoride ($NF_3$) gas, an oxygen ($O_2$) gas, and/or a chlorine ($Cl_2$) gas. The etching gas EG may be composed of the nitrogen trifluoride gas, the oxygen gas, and/or the chlorine gas. The etching gas EG may not include (e.g., may exclude) sulfur hexafluoride $SF_6$ in some embodiments. In the dry-etching of the preliminary electrode layer GT-P, the etching gas may include (e.g., be) nitrogen trifluoride replaced with sulfur hexafluoride, while additionally including (e.g., being) a chlorine gas to improve etching efficiency. The chlorine gas may additionally induce a generation reaction of a $MoO_xCl_y$ gas, a $MoCl_x$ gas, and/or the like in the etching process to improve dry etching efficiency.

In the etching gas EG, the partial pressure of the nitrogen trifluoride gas may be about 50 mT (50 mTorr) to about 80 mT. For example, the partial pressure of the nitrogen trifluoride gas in the etching gas EG may be about 60 mT. When the partial pressure of the nitrogen trifluoride gas in the etching gas EG is less than 50 mT, the etch rate of the molybdenum (Mo) included in the preliminary electrode layer GT-P is lowered, and the photoresist pattern/electrode etch selectivity ratio is increased, so that the dry-etching efficiency utilizing a photoresist pattern as a mask may be degraded. In the present specification, the "photoresist pattern/electrode etch selectivity ratio" may refer to a ratio of an etch rate of the photoresist pattern PR to an etch rate of the molybdenum included in the preliminary electrode layer GT-P. For example, an increase in the photoresist pattern/electrode etch selectivity ratio may correspond to a decrease in a rate at which molybdenum included in the preliminary electrode layer GT-P is etched compared to an etch rate of the photoresist pattern PR, and may refer to the efficiency of etching the preliminary electrode layer GT-P being reduced.

When the partial pressure of the nitrogen trifluoride gas in the etching gas EG is greater than 80 mT, it may be difficult to implement the process.

In the etching gas EG, the flow rate of the nitrogen trifluoride gas may be about 50 sccm (50 standard cubic centimeters per minute) to about 150 sccm. For example, the flow rate of the nitrogen trifluoride gas in the etching gas EG may be about 100 sccm. When the flow rate of the nitrogen trifluoride gas in the etching gas EG is less than 50 sccm, it may be difficult to implement the process. When the flow rate of the nitrogen trifluoride gas in the etching gas EG is greater than 150 sccm, the etch rate of the molybdenum (Mo) included in the preliminary electrode layer GT-P is lowered, and the photoresist pattern/electrode etch selectivity ratio is increased, so that the dry-etching efficiency utilizing a photoresist pattern as a mask may be degraded.

In the etching gas EG, the ratio of the nitrogen trifluoride gas to the total amount of the nitrogen trifluoride gas and the oxygen gas may be about 30% to about 50%. For example, the ratio of the nitrogen trifluoride gas to the total amount of the nitrogen trifluoride gas and the oxygen gas may be about 40%. For example, in the etching gas EG, the ratio of the nitrogen trifluoride gas to the total amount of the nitrogen trifluoride gas and the oxygen gas may be about 40%, and the ratio of the oxygen gas may be about 60%. When the ratio of the nitrogen trifluoride gas to the total amount of the nitrogen trifluoride gas and the oxygen gas is less than 30%, the etch rate of photoresist is lowered, but the etch rate of molybdenum is even further lowered, so that the photoresist pattern/electrode etch selectivity ratio may be increased, and accordingly, the dry-etching efficiency utilizing a photoresist pattern as a mask may be degraded. When the ratio of the nitrogen trifluoride gas to the total amount of the nitrogen trifluoride gas and the oxygen gas is greater than 50%, the etch rate of photoresist is increased, but the etch rate of molybdenum is lowered, so that the photoresist pattern/electrode etch selectivity ratio may be increased, and accordingly, the dry-etching efficiency utilizing a photoresist pattern as a mask may be degraded.

The etching gas EG may include a chlorine gas, wherein the flow rate of the chlorine gas in the etching gas EG may be about 30 sccm to about 90 sccm. For example, the flow rate of the chlorine gas in the etching gas EG may be about 50 sccm. When the flow rate of the chlorine gas in the etching gas EG is less than 30 sccm, it may be difficult to implement the process. When the flow rate of the nitrogen trifluoride gas in the etching gas EG is greater than 90 sccm, the etch rate of the molybdenum (Mo) included in the preliminary electrode layer GT-P is lowered, and the photoresist pattern/electrode etch selectivity ratio is increased, so that the dry-etching efficiency utilizing a photoresist pattern as a mask may be degraded.

After the dry-etching of the preliminary electrode layer GT-P by providing the etching gas EG, the electrode main body part GT1-M of the first control electrode GT1 (see FIG. 5) and the residue RS disposed on the surface of the electrode main body part GT1-M may be formed. The residue RS may be some components included in the nitrogen trifluoride gas, the oxygen gas, and/or the chlorine gas, all included in the etching gas EG, and still remaining therein. The residue RS may include (e.g., be) chlorine and/or nitrogen. In the etching process, because the upper surface GT1-U of the electrode main body part GT1-M is covered by the photoresist pattern PR, the etching gas EG may not be provided to the upper surface GT1-U of the electrode main body part GT1-M, so that the residue RS is formed only on the side surfaces GT1-L of the electrode main body part GT1-M, and may not be formed on the upper surface GT1-U.

After the dry-etching of the preliminary electrode layer GT-P by providing the etching gas EG, the formed side surface GT1-L of the electrode main body part GT1-M may be formed as an inclined surface inclined at a set or predetermined angle with the upper surface of the first insulation layer 10 providing the base surface. The first angle 81, which may be an angle between the side surface GT1-L of the electrode main body part GT1-M and the upper surface of the first insulation layer 10, may be about 40 degrees to about 80 degrees. For example, the first angle 81 may be about 45 degrees to about 55 degrees.

In the dry-etching, a side surface of the photoresist pattern PR may be formed as an inclined surface inclined at a set or predetermined angle with the upper surface GT1-U of the electrode main body part GT1-M. A second angle 82, which is an angle between the side surface of the photoresist pattern PR and the upper surface GT1-U of the electrode main body part GT1-M, may be less than or equal to the first angle 81. For example, the second angle 82 may be about 30 degrees to about 70 degrees.

Figure 7D:
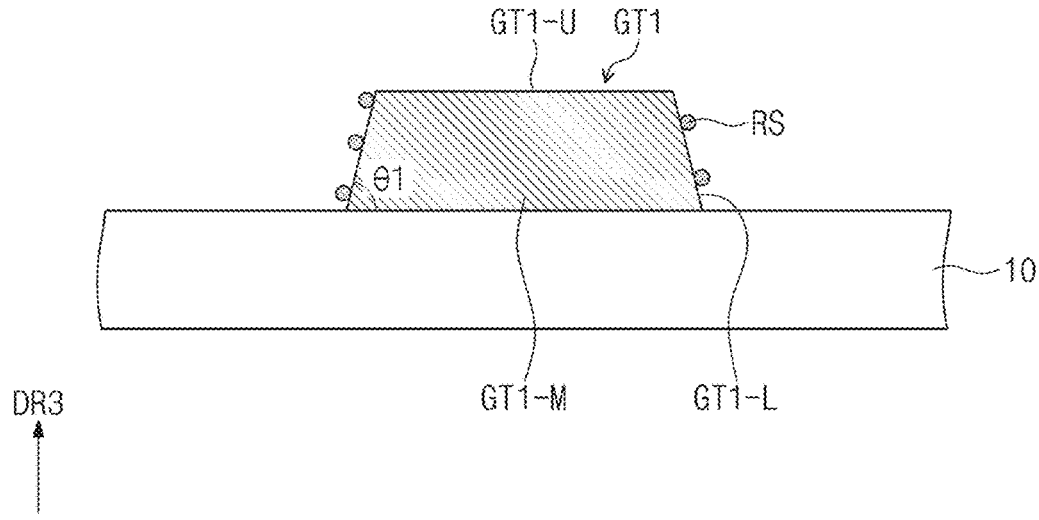

Referring to FIG. 7C and FIG. 7D together, the providing of the control electrode may further include, after the dry-etching, removing the photoresist pattern PR. The photoresist pattern PR may be removed by a wet-etching process by providing an etchant. Because the photoresist pattern PR is removed after the dry-etching, the residue RS derived from the etching gas is formed only on the side surfaces GT1-L of the electrode main body part GT1-M as described above, and may not be formed on the upper surface GT1-U that was covered by the photoresist pattern PR.

The providing of the control electrode may further include, after the dry-etching, cleaning the surface of the first control electrode GT1. The residue RS may be one not removed by the cleaning but still remaining on the surface of the electrode main body part GT1-M. For example, the residue RS may be configured (e.g., have a composition) such that it is not removed (e.g., substantially not removed) during the cleaning process.

In a task of providing a control electrode including (e.g., being) molybdenum, such as the first control electrode GT1, the method for manufacturing a display panel according to an embodiment of the present disclosure may use a nitrogen trifluoride ($NF_3$) gas, an oxygen ($O_2$) gas, and/or a chlorine ($Cl_2$) as an etching gas applied to dry-etching, and the etching gas may not include (e.g., may exclude) sulfur hexafluoride ($SF_6$). Accordingly, it is possible to reduce the generation amount of a carbon dioxide ($CO_2$) gas generated during the process of providing a control electrode, while implementing etching efficiency similar to that of etching a control electrode through sulfur hexafluoride, so that the yield and reliability of a display panel manufacturing process may be improved.

For example, a sulfur hexafluoride gas utilized in a typical etching process has a large generation amount of fluorine radical (F*radical) compared to a nitrogen trifluoride gas, a carbon tetrafluoride ($CF_4$), and/or the like, which are different fluorine-containing gases, and thus, has excellent or suitable etching efficiency of a molybdenum control electrode, but has a very high generation amount of carbon dioxide per unit weight, and thus, has a difficulty in implementing an eco-friendly display panel manufacturing process in which the generation amount of carbon dioxide is low. The method for manufacturing a display panel according to an embodiment of the present disclosure uses a nitrogen trifluoride gas, which generates less carbon dioxide per unit weight than a sulfur hexafluoride gas does, as a main etching gas, thereby reducing the generation amount of carbon dioxide generated, while additionally including a chlorine gas in the etching gas to induce a generation reaction of a $MoO_xCl_y$ gas, a $MoCl_x$ gas, and/or the like, and thus, may implement etching efficiency similar to that of an etching process utilizing the sulfur hexafluoride gas as a main etching gas. Accordingly, it is possible to implement a manufacturing process of an eco-friendly display panel while increasing the yield and reliability of the display panel manufacturing process.

Figure 8A:
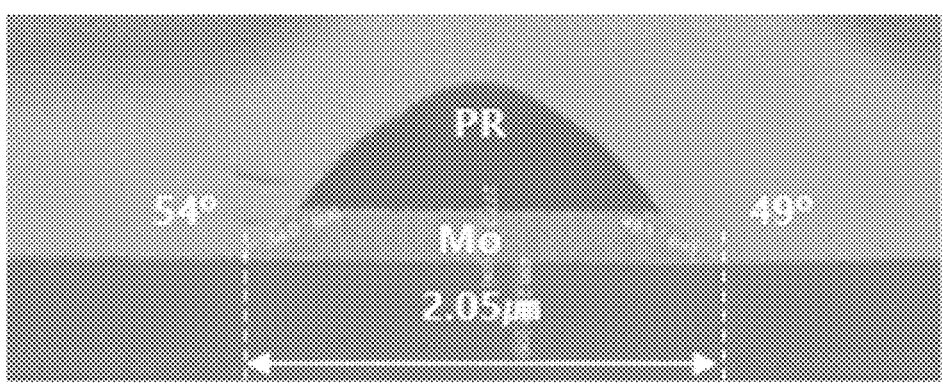
FIG. 8A is a captured image showing the shape of a control electrode according to a comparative example.
Figure 8B:
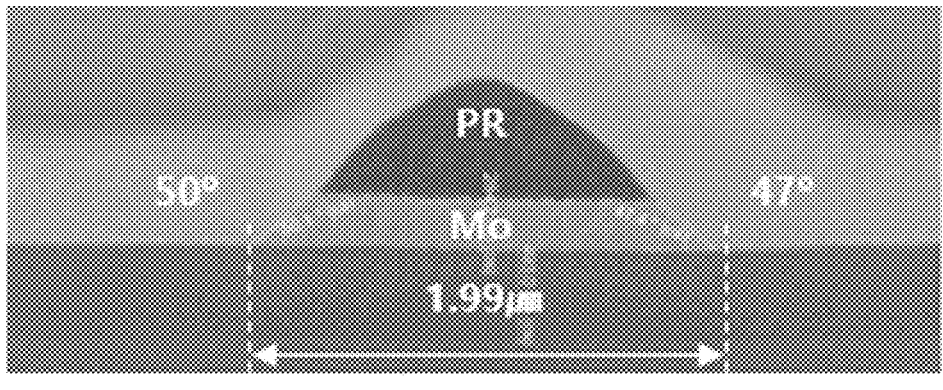
FIG. 8B is a captured image showing the shape of a control electrode according to an embodiment of the present disclosure.
Figure 9A:
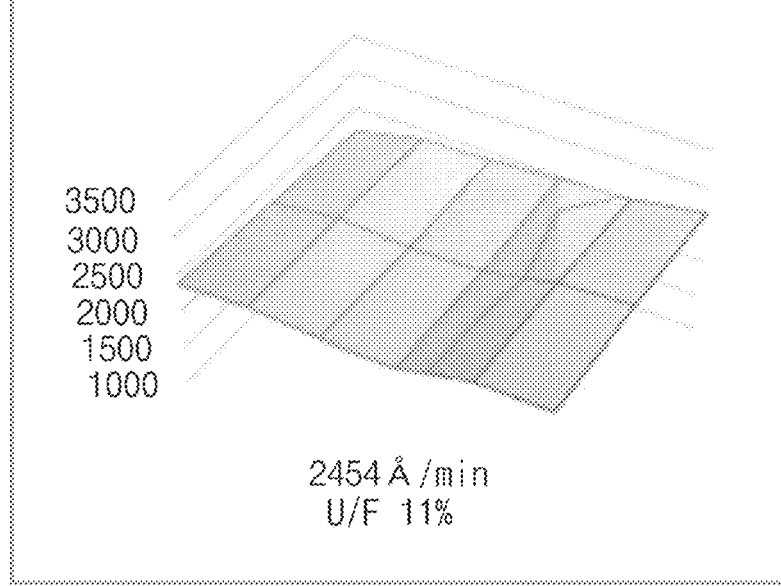
FIG. 9A is an image showing etching reproducibility evaluation data of a control electrode according to a comparative example.
Figure 9B:
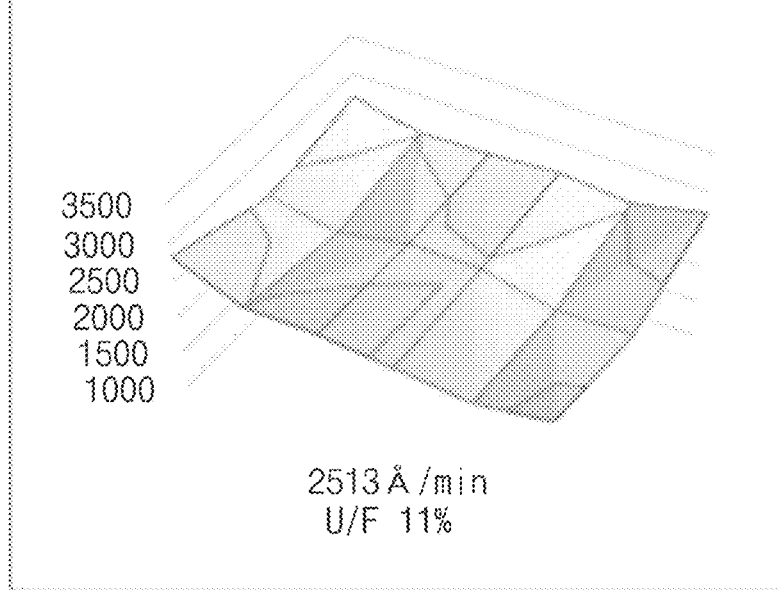
FIG. 9B is an image showing etching reproducibility evaluation data of a control electrode according to an embodiment of the present disclosure.

FIG. 8A and FIG. 8B are respectively captured images showing the shape of a control electrode manufactured through some tasks of the method for manufacturing a display panel according to a comparative example, and the shape of a control electrode according to an embodiment of the present disclosure. FIG. 9A and FIG. 9B are respectively images showing the etching reproducibility evaluation data of a control electrode manufactured through some tasks of the method for manufacturing a display panel according to a comparative example, and the etching reproducibility evaluation data of a control electrode according to an embodiment of the inventive concept. FIG. 8A is a captured image of the control electrode of the comparative example, in which a molybdenum electrode layer is etched utilizing a sulfur hexafluoride gas and an oxygen gas as an etching gas in the dry-etching process illustrated in FIG. 7B. FIG. 8B is a captured image of a control electrode according to an embodiment, in which a molybdenum electrode layer is etched utilizing a nitrogen trifluoride gas, an oxygen gas, and a chlorine gas in the dry-etching process illustrated in FIG. 7B. FIG. 9A is an image showing the etching reproducibility evaluation data of the control electrode according to the comparative example, and FIG. 9B is an image showing the etching reproducibility evaluation data of the control electrode of the embodiment.

Referring to FIG. 8A and FIG. 8B together, it can be confirmed that the control electrode of the comparative example etched utilizing the sulfur hexafluoride gas and the oxygen gas has a width of about 2.05 micrometers in one direction, and the control electrode of the embodiment etched utilizing the nitrogen trifluoride gas, the oxygen gas, and the chlorine gas has a width of about 1.99 micrometers in one direction. It can be confirmed that a side surface of the control electrode of the comparative example has an inclination angle of about 54 degrees and about 49 degrees with respect to a lower insulation layer, and a side surface of the control electrode of the embodiment has an inclination angle of about 50 degrees and about 47 degrees with respect to the lower insulation layer. The control electrode of the comparative example etched utilizing the sulfur hexafluoride gas and the oxygen gas, and the control electrode of the embodiment etched utilizing the nitrogen trifluoride gas, the oxygen gas, and the chlorine gas have similar profiles such as the width of the control electrode, the lateral inclination angle of the control electrode, and the like. In some embodiments, as shown in FIG. 9A and FIG. 9B, it can be confirmed that the control electrode of the comparative example and the control electrode of the embodiment have a similar average electrode etch rate and similar uniformity even in the etching reproducibility evaluation results.

Through the above, it can be confirmed that in the process of etching a control electrode of an embodiment, while the generation of a carbon dioxide gas generated in the etching process is reduced by utilizing a nitrogen trifluoride gas, an oxygen gas, and a chlorine gas, a control electrode has a similar level of profiles to that of a control electrode etched utilizing a typical sulfur hexafluoride gas, and it is possible to provide an electrode having similar etching reproducibility.

According to an embodiment of the present disclosure, it is possible to implement high etching efficiency while reducing the generation amount of carbon dioxide by utilizing a fluorine-based gas having a relatively small amount of carbon dioxide generated in a control electrode etching process, so that the yield and reliability of a display panel manufacturing process may be improved.

Although the present disclosure has been described with reference to example embodiments of the present disclosure, it will be understood by those skilled in the art that one or more suitable changes in form and details may be made therein without departing from the spirit and scope of the present disclosure as set forth in the following claims and equivalents thereof.

A device for manufacturing a display panel, the display panel, and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

Accordingly, the technical scope of the present disclosure is not intended to be limited to the contents set forth in the detailed description of the specification, but is intended to be defined by the appended claims and equivalents thereof.

What is claimed is:

1. A display panel comprising:
a base layer;

at least one thin film transistor on the base layer; and
a light emitting element electrically coupled to the at least one thin film transistor,
wherein the at least one thin film transistor comprises:
a first semiconductor pattern on the base layer; and
a first control electrode on the first semiconductor pattern, and overlapping at least a portion of the first semiconductor pattern, and
wherein the first control electrode comprises molybdenum, nitrogen and chlorine.

2. The display panel of claim 1, wherein the first control electrode comprises:
an electrode main body part comprising the molybdenum; and
a residue on a surface of the electrode main body part, and comprising the nitrogen and the chlorine.

3. The display panel of claim 2, wherein the electrode main body part comprises:
an upper surface parallel to the base layer; and
a side surface extended from the upper surface, and
wherein the residue is on the side surface of the electrode main body part.

4. The display panel of claim 3, wherein the residue is not on the upper surface.

5. The display panel of claim 1, wherein the first semiconductor pattern comprises an active region, a source region, and a drain region, and
wherein the first control electrode overlaps the active region.

6. The display panel of claim 1, further comprising a first insulation layer on the base layer, and covering the first semiconductor pattern,
wherein the first insulation layer is between the first semiconductor pattern and the first control electrode.

7. The display panel of claim 1, wherein the first control electrode does not comprise any sulfur.

8. The display panel of claim 1, wherein a width of the first control electrode is about 1.5 micrometers to about 2.5 micrometers.

9. A thin film transistor comprising:
a first semiconductor pattern comprising an active region, a source region, and a drain region;
at least one insulation layer on the first semiconductor pattern; and
a first control electrode on the at least one insulation layer, and overlapping the active region of the first semiconductor pattern, wherein the first control electrode comprises molybdenum, nitrogen and chlorine.

10. The thin film transistor of claim 9, wherein the first control electrode comprises:
an electrode main body part comprising the molybdenum; and
a residue on a surface of the electrode main body part, and comprising the nitrogen and the chlorine.

* * * * *